United States Patent
Shimizu

(10) Patent No.: US 10,451,680 B2
(45) Date of Patent: Oct. 22, 2019

(54) SEMICONDUCTOR DEVICE, BATTERY MONITORING SYSTEM, AND SEMICONDUCTOR DEVICE DIAGNOSING METHOD

(71) Applicant: LAPIS SEMICONDUCTOR CO., LTD., Kanagawa (JP)

(72) Inventor: Yuuichi Shimizu, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/385,973

(22) Filed: Dec. 21, 2016

(65) Prior Publication Data

US 2017/0184676 A1    Jun. 29, 2017

(30) Foreign Application Priority Data

Dec. 25, 2015  (JP) ................ 2015-254773

(51) Int. Cl.
   *G01R 31/3835* (2019.01)
   *G01R 31/396* (2019.01)
   *H02J 7/00* (2006.01)

(52) U.S. Cl.
   CPC ....... *G01R 31/3835* (2019.01); *G01R 31/396* (2019.01); *H02J 7/0021* (2013.01)

(58) Field of Classification Search
   CPC .. G01R 31/362; G01R 31/3658; H02M 3/155
   See application file for complete search history.

(56) References Cited

U.S. PATENT DOCUMENTS

| 2006/0267670 | A1* | 11/2006 | Koyama | G06F 1/26 327/536 |
| 2010/0207929 | A1* | 8/2010 | Miyazaki | G09G 3/3696 345/213 |
| 2011/0074435 | A1* | 3/2011 | Mizoguchi | G01R 35/00 324/433 |
| 2012/0081167 | A1* | 4/2012 | Ban | H02J 7/0021 327/333 |
| 2014/0205865 | A1* | 7/2014 | Matsuo | G01R 31/362 429/7 |

FOREIGN PATENT DOCUMENTS

JP    2011232161 A    11/2011
JP    2012078136 A    4/2012

* cited by examiner

*Primary Examiner* — Akm Zakaria
(74) *Attorney, Agent, or Firm* — Volentine, Whitt & Francos, PLLC

(57) ABSTRACT

A semiconductor device including a power supply input section to which a first voltage from a battery cell is input; a boosting section including one end to which the first voltage from the power supply input section is input, and another end that, based on a control signal from a controller, outputs the first voltage or a second voltage boosted from the first voltage from as a power supply voltage; and a comparison section including an output section, a first input section connected to the power supply input section and the one end of the boosting section, and a second input section connected to the another end of the boosting section, the comparison section outputting a voltage from the output section that corresponds to a difference between voltages input to the first input section and the second input section.

4 Claims, 5 Drawing Sheets

RELATED ART

SEMICONDUCTOR DEVICE, BATTERY MONITORING SYSTEM, AND SEMICONDUCTOR DEVICE DIAGNOSING METHOD

CROSS-REFERENCE TO RELATED APPLICATION

This application claims priority under 35 USC 119 from Japanese Patent Application No. 2015-254773, filed on Dec. 25, 2015, the disclosure of which is incorporated by reference herein.

BACKGROUND

Technical Field

The present disclosure relates to a semiconductor device, a battery monitoring system, and a semiconductor device diagnosing method.

Related Art

Battery monitoring semiconductor devices for monitoring/controlling a battery cell are known. Examples of such battery monitoring semiconductor devices include battery monitoring integrated circuits (ICs) for monitoring/controlling a battery cell installed in a vehicle or the like.

In such battery monitoring IC, a battery voltage at a high potential side of a battery cell and a battery voltage at a low potential side of the battery cell a compared using a comparison section such as an analog level shifter, and a battery voltage of the battery cell is measured based on a difference between both of these voltages. Here, the accuracy of the battery voltage measurement can be improved by inputting the battery voltage to the comparison section through a buffer amplifier.

The input voltage input from the high potential side of the battery cell (the highest potential side in cases including plural battery cells) subject to monitoring is sometimes used as the power supply voltage that drives the buffer amplifier of the battery monitoring IC employed. In such cases, an offset voltage arises in the output voltage of the buffer amplifier, and the accuracy of the battery voltage measurement may decrease.

Japanese Patent Application Laid-Open (JP-A) No. 2011-232161 discloses a battery monitoring IC provided with a boosting circuit that boost an input voltage. In the technology described in JP-A 2011-232161, an offset voltage arising in an output voltage of a buffer amplifier is suppressed, and the accuracy of battery voltage measurement is increased, by driving the buffer amplifier with a power supply voltage boosted from the input voltage by the boosting circuit.

In recent years, demand has increased for such battery monitoring ICs to be equipped with functionality to diagnose internal circuitry and the like. Japanese Patent Application Laid-Open (JP-A) No. 2012-78136 discloses technology that utilizes saturation current of a transistor provided in the buffer amplifier to diagnose malfunction in the above boosting circuit of a battery monitoring IC.

A circuit diagram of the battery monitoring system described in JP-A 2012-78136 that diagnoses the boosting circuit is illustrated in FIG. 4. In JP-A 2012-78136, a voltage that was boosted from a voltage V5 by a boosting circuit (not illustrated) or the voltage V5 is selectively supplied, as power supply voltage VCCUP, to the buffer amplifiers 30, 32. A circuit diagram of a specific example of the buffer amplifiers 30, 32 is illustrated in FIG. 5. The buffer ampli-fiers 30, 32 include: PMOS transistors 80, 82, 84, and 86; capacitor 88; and NMOS transistors 90, 92, and 94.

In the battery monitoring IC 120 illustrated in FIG. 4, in a case in which a power supply voltage VCCUP that was boosted by the boosting circuit is supplied as a drive voltage to the buffer amplifiers 30, 32, a voltage Vx1 output from the buffer amplifier 30 is the voltage V5, and a voltage Vy1 output from the buffer amplifier 32 is a voltage V4. An output Vout that is output from the comparison section 28 is the difference between the voltage V5 and the voltage V4 (V5−V4), the battery voltage of the battery cell Vc5.

However, in a case in which voltage V5 is supplied to the buffer amplifiers 30, 32 as a driving power supply voltage VCCUP, the voltage V5 input to the non-inverting input terminal of the buffer amplifier 30 and the power supply voltage VCCUP are substantially equivalent.

In a case in which the value of the voltage input to the non-inverting input terminal of the buffer amplifier 30 and the value of drive voltage of the buffer amplifier 30 are substantially equivalent, the MOS transistors in the buffer amplifier 30 (the PMOS transistors 80, 82, 84, and 86 and the NMOS transistors 90, 92, and 94 illustrated in FIG. 3) operate in the non-saturated region, the offset voltage in the output of the buffer amplifier 30 increases, and the voltage Vx1 output from the buffer amplifier 30 becomes V5−Vsat1. Further, since a potential difference between the voltage V4 input to the non-inverting input terminal and the power supply voltage VCCUP is present in the buffer amplifier 32, the output voltage of the buffer amplifier 32 becomes voltage V4. Thus, the output Vout output from the comparison section 28 (amplifier 40) becomes the difference between voltage V5−Vsat1 and the voltage V4 (V5−V4−Vsat1).

Accordingly, in a conventional battery monitoring system such as shown in FIG. 4, whether or not operation of the boosting circuit is normal is diagnosed by comparing an output Vout in a case in which a power supply voltage VCCUP supplied to the buffer amplifiers 30, 32 is a voltage that was boosted from a voltage V5 and an output Vout in a case in which the power supply voltage VCCUP is the voltage V5.

However, in a case in which the power supply voltage VCCUP of the buffer amplifiers 30, 32 is set to the voltage V5, and in a case in which the battery voltage of the battery cell Vc5 is low, the potential difference between the power supply voltage VCCUP and the voltage V4 is reduced, and the MOS transistors in the buffer amplifier 32 operate in the non-saturated region. Consequently, the offset voltage in the output of the buffer amplifier 32 increases, and the voltage Vy1 output from the buffer amplifier 32 becomes V4−Vsat2.

In a case in which the battery voltage of the battery cell Vc5 is low, the output Vout output from the comparison section 28 becomes the difference between the voltage V5−Vsat1 and the voltage V4−Vsat2 (V5−V4−Vsat1+Vsat2), and the variation in the output Vout due to the presence or absence of boosting by the boosting circuit decreases. Namely, in the method for diagnosing the boosting circuit described in JP-A 2012-78136, in a case in which the battery voltage of the battery cell Vc5 is low, the accuracy of diagnosing the boosting circuit may decrease.

SUMMARY

The present disclosure provides a semiconductor device, a battery monitoring system, and a method for diagnosing a semiconductor device that may diagnose malfunction in a boosting section even in a case in which a voltage of a battery cell is low.

A first aspect of the present disclosure is a semiconductor device including: a power supply input section to which a first voltage from a battery cell is input; a boosting section including one end to which the first voltage from the power supply input section is input, and another end that, based on a control signal from a controller, outputs the first voltage or a second voltage boosted from the first voltage from as a power supply voltage; and a comparison section including an output section, a first input section connected to the power supply input section and the one end of the boosting section, and a second input section connected to the another end of the boosting section, the comparison section outputting a voltage from the output section that corresponds to a difference between voltages input to the first input section and the second input section.

A second aspect of the present disclosure is a battery monitoring system including: a battery cell; the semiconductor device of the first aspect; and a diagnostic section that instructs the semiconductor device to measure a battery voltage of the battery cell.

A third aspect of the present disclosure is a method for diagnosing a semiconductor device, the method including: inputting, to a power supply input section, an input voltage from a battery cell; boosting, by a boosting circuit, the input voltage input to one end of the boosting circuit through the power supply input section, and outputting a power supply voltage from another end of the boosting circuit; and outputting, by a comparison section, a voltage difference between a voltage output from an output terminal of a first buffer section and a voltage output from an output terminal of a second buffer section, the first buffer section being driven by the power supply voltage and including the output terminal and an input terminal to which the power supply voltage from the another end of the boosting circuit is input, and the second buffer section being driven by the power supply voltage and including the output terminal and an input terminal input to which the input voltage from the one end of the boosting circuit is input.

According to the above aspects, the present disclosure provides a semiconductor device, a battery monitoring system, and a method for diagnosing a semiconductor device that may diagnose malfunction in a boosting section, even in a case in which a voltage of a battery cell is low.

BRIEF DESCRIPTION OF THE DRAWINGS

Exemplary embodiments will be described in detail based on the following figures, wherein.

DETAILED DESCRIPTION

Detailed explanation follows regarding a battery monitoring system and a battery monitoring semiconductor device (referred to below as a "battery monitoring IC") of the present exemplary embodiment with reference to the drawings. The battery monitoring system (battery monitoring IC) of the present exemplary embodiment is applicable to products utilizing battery LSI (for example, assembled battery). Examples of such products include personal computers, cars, motorcycles, and electric tools.

Figure 1:
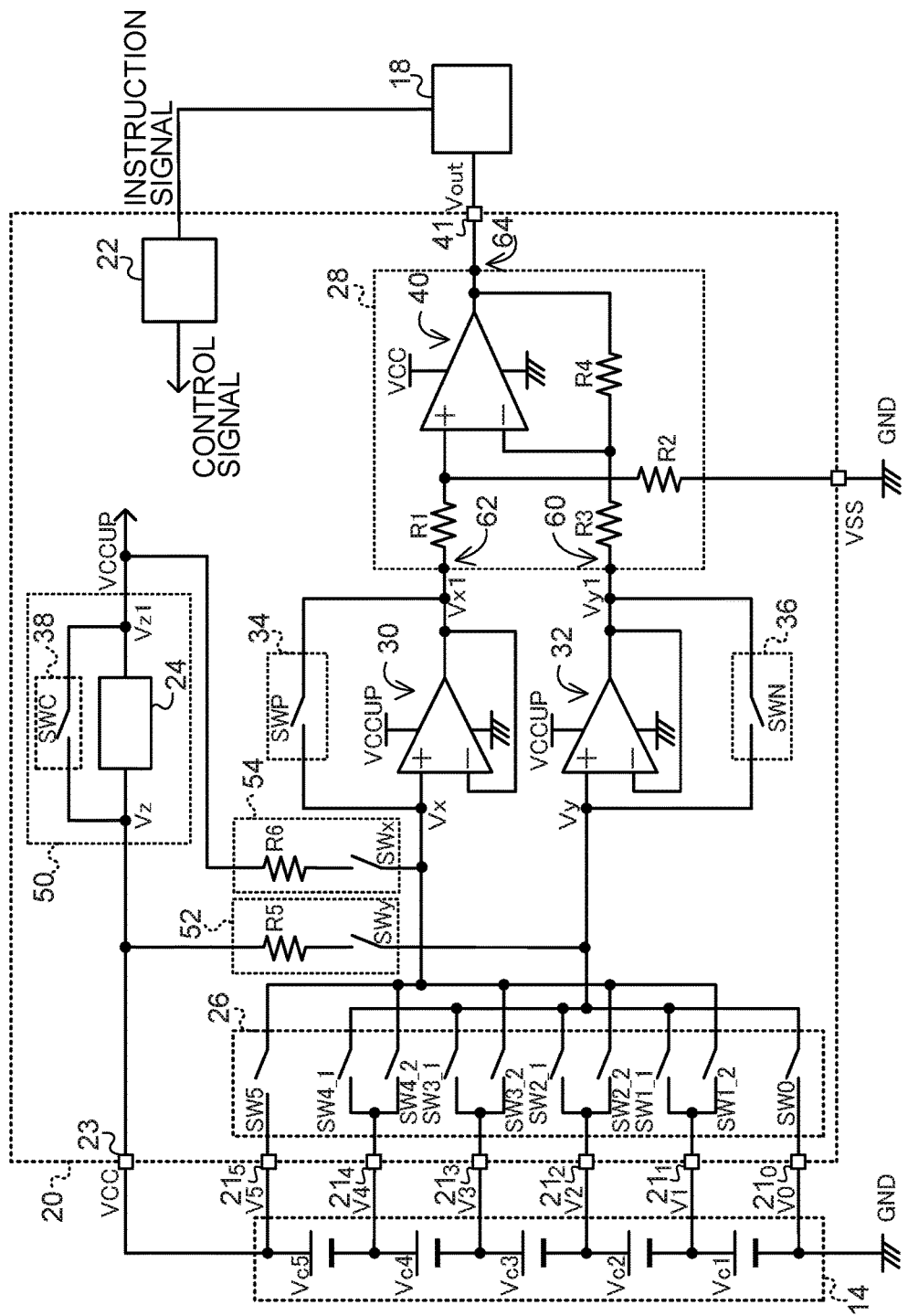
FIG. 1 is a circuit diagram of a battery monitoring IC according to an exemplary embodiment.

Explanation follows regarding detailed configuration of a battery monitoring IC 20 of the present exemplary embodiment. FIG. 1 illustrates an example circuit diagram of an assembled battery 14, the battery monitoring IC 20, and a diagnostic section 18 of the present exemplary embodiment.

The assembled battery 14 includes five battery cells Vc1 to Vc5 connected together in series (referred to generally as "battery cells Vc"). The battery cells Vc1 to Vc5 are connected together in series, with the battery cell Vc1 at the lowermost level and battery cell Vc5 at the uppermost level. Specific examples of the battery cells Vc include nickel-metal hydride batteries and lithium-ion batteries. Although FIG. 1 illustrates a specific example in which there are n=5 battery cells Vc in the assembled battery 14, where n is the number of battery cells Vc in the assembled battery 14, there is no particular limitation thereto.

Each of the battery cells Vc1 to Vc5 is connected to the battery monitoring IC 20. For example, a voltage V0 at the low potential side of the battery cell Vc1 is input to an input terminal $21_0$ of the battery monitoring IC 20, and a voltage V1 at the high potential side of the battery cell Vc1 (this being the same as the voltage of the low potential side of the battery cell Vc2) is input to an input terminal $21_1$.

The high potential side of the battery cell Vc5 is connected to a power supply terminal 23 of the battery monitoring IC 20. The power supply terminal 23 is an example of a power supply input section.

The battery monitoring IC 20 includes a controller 22, a boosting section 50, a cell selection switch 26, a comparison section 28, buffer amplifier 30, a buffer amplifier 32, a bypass section 34, a bypass section 36, a first series element section 52, and a second series element section 54. The buffer amplifier 30 is an example of a first buffer section, and the buffer amplifier 32 is an example of a second buffer section. The bypass section 34 is an example of a second bypass section, and the bypass section 36 is an example of a third bypass section.

A voltage VCC from the power supply terminal 23 is input to one end of the boosting section 50. The boosting section 50 outputs, from another end, either the voltage VCC, or a power supply voltage VCCUP that is boosted from the voltage VCC, based on a control signal from the controller 22. The boosting section 50 includes a boosting circuit 24 and a bypass section 38. The voltage VCC is an example of a first voltage, and the power supply voltage VCCUP is an example of a second voltage. The voltage VCC, which corresponds to the highest potential of the assembled battery 14, is input to the one end of the boosting section 50 through the power supply terminal 23. The boosting circuit 24 boost the voltage VCC to the power supply voltage VCCUP (VCC<VCCUP). The boosting section 50 supplies the power supply voltage VCCUP that was boosted by the boosting circuit 24 to the buffer amplifiers 30, 32 from the other end. As a specific example, the boosting section 50 of the present exemplary embodiment is input with the voltage VCC to the one end, and outputs the power supply voltage VCCUP, which is the voltage VCC boosted by approximately 5 V (VCC+5=VCCUP), from the other end.

The bypass section 38 of the present exemplary embodiment includes a switching element SWC, and creates a bypass between the one end (input side) and the other end (output side) of the boosting circuit 24. The bypass section 38 of the present exemplary embodiment is an example of a first bypass section, and the switching element SWC is an example of a first switch. The controller 22 outputs a control signal to turn the switching element SWC ON and OFF, and outputs a control signal to turn the boosting circuit 24 ON and OFF. In the ON state, the switching element SWC connects the one end and the other end of the boosting circuit 24. The boosting of the boosting circuit 24 is stopped in a case in which the switching element SWC is in the ON state. Thus, in a case in which the switching element SWC is turned to the ON state, the voltage VCC input through the power supply terminal 23 does not pass the boosting circuit 24 (namely is not boosted) and is supplied as the power supply voltage VCCUP. Due to the boosting circuit 24 and the bypass section 38 being controlled by the controller 22, the power supply voltage supplied to the buffer amplifiers 30, 32 can be switched between either a voltage that is an unaltered voltage VCC or a boosted voltage.

The cell selection switch 26 includes switching elements SW0, SW1_1, SW1_2, SW2_1, SW2_2, SW3_1, SW3_2, SW4_1, SW4_2, and SW5. These switching elements provided to the cell selection switch 26 are referred to generally below as "the switching elements SW of the cell selection switch 26."

The switching elements SW of the cell selection switch 26 are turned ON and OFF by control signals output from the controller 22. In the ON state, each of the switching elements SW1_2, SW2_2, SW3_2, SW4_2, and SW5 connects a respective input terminal $21_1$ to $21_5$ and the non-inverting input terminal of the buffer amplifier 30. In the ON state, each of the switching elements SW0, SW1_1, SW2_1, SW3_1, and SW4_1 connects a respective input terminal $21_0$ to $21_4$ and the non-inverting input terminal of the buffer amplifier 32.

The cell selection switch 26 is connected to the non-inverting input terminal of the buffer amplifier 30. The other end (the output side) of the boosting circuit 24 is connected to the non-inverting input terminal of the buffer amplifier 30 via the second series element section 54. The second series element section 54, for example, includes a resistance element R6 and a switching element SWx connected together in series as illustrated in FIG. 1. The resistance element R6 is an example of a second resistance element, and the switching element SWx is an example of a third switch. The switching element SWx is turned ON and OFF by a control signal output from the controller 22. In a case in which the switching element SWx is in the ON state, the power supply voltage VCCUP is input to the non-inverting input terminal of the buffer amplifier 30. Further, the output terminal and the inverting input terminal of the buffer amplifier 30 are connected.

The bypass section 34 includes a switching element SWP (this being an example of a fourth switch) and creates a bypass between the non-inverting input terminal and the output terminal of the buffer amplifier 30. The switching element SWP is turned ON and OFF by a control signal output from the controller 22. In the ON state, the switching element SWP connects the non-inverting input terminal and the output terminal of the buffer amplifier 30.

The cell selection switch 26 is connected to the non-inverting input terminal of the buffer amplifier 32. The one end (the input side) of the boosting circuit 24 is connected to the non-inverting input terminal of the buffer amplifier 32 via the first series element section 52. The first series element section 52, for example, includes a resistance element R5 and a switching element SWy connected together in series as illustrated in FIG. 1. The resistance element R5 is an example of a first resistance element, and the switching element SWy is an example of a second switch. The switching element SWy is turned ON and OFF by a control signal output from the controller 22. In a case in which the switching element SWy is in the ON state, the voltage VCC is input to the non-inverting input terminal of the buffer amplifier 32. Further, the output terminal and the inverting input terminal of the buffer amplifier 32 are connected.

The bypass section 36 includes a switching element SWN (this being an example of a fifth switch) and creates a bypass between the non-inverting input terminal and the output terminal of the buffer amplifier 32. The switching element SWN is turned ON and OFF by a control signal output from the controller 22. In an ON state, the switching element SWN connects the non-inverting input terminal and the output terminal of the buffer amplifier 32.

The resistance element R5 and the resistance element R6 regulate the voltage input to the comparison section 28 to a desired value, and protects the comparison section 28 from excess current from the assembled battery 14.

The comparison section 28 includes: resistance elements R1, R2, R3, and R4; an amplifier 40; input sections 60, 62; and an output section 64. The input section 60 is an example of a first input section, and the input section 62 is an example of a second input section.

The output terminal of the buffer amplifier 30 is connected to the non-inverting input terminal of the amplifier 40, and voltage output from the buffer amplifier 30 is input to the non-inverting input terminal of the amplifier 40 via the resistance element R1. One end of the resistance element R2 is connected to between the non-inverting input terminal of the amplifier 40 and the resistance element R1, and another end of the resistance element R2 is connected to GND (reference potential VSS). The output terminal of the buffer amplifier 32 is connected to the non-inverting input terminal of the amplifier 40, and voltage output from the buffer amplifier 32 is input to the non-inverting input terminal of the amplifier 40 through the resistance element R3. The output terminal and the inverting input terminal of the amplifier 40 are connected via the resistance element R4.

An output Vout that corresponds to a difference between the voltage output from the output terminal of the buffer amplifier 30 and the voltage output from the buffer amplifier 32 is output from the comparison section 28, through an output terminal 41, to a diagnostic section 18.

Next, explanation is given regarding operation of the battery monitoring IC 20 of the present exemplary embodiment.

First, explanation is given regarding measurement of the battery voltages of battery cells Vc1 to Vc5 by the battery monitoring IC 20 of the present exemplary embodiment. In the battery monitoring IC 20 of the present exemplary embodiment, measurement of the battery voltages is performed under control of the controller 22 in a case in which an instruction signal indicating that battery voltages are to be measured is input to the controller 22 from the diagnostic section 18.

For example, in a case in which measuring the voltage value of the battery cell Vc2 (V2−V1=Vc2), the switching elements SW1_1 and SW2_2 of the cell select switch 26 are turned to the ON state, and the other switching elements SW are turned to the OFF state. A drop in voltage due to the switching elements SW1_1 and SW2_2 can be ignored since buffer amplifiers 30, 32 have high input impedances. Accordingly, a voltage Vx input to the non-inverting input terminal of the buffer amplifier 30 becomes V2, and a voltage Vy input to the non-inverting input terminal of the buffer amplifier 32 becomes V1. Consequently, the output Vout of the comparison section 28 becomes V2−V1=Vc2, and is converted to a voltage relative to ground and output to the diagnostic section 18.

Explanation follows regarding the reason why the battery monitoring IC 20 of the present exemplary embodiment uses the boosting circuit 24 to boost the voltage VCC to the power supply voltage VCCUP.

Figure 5:
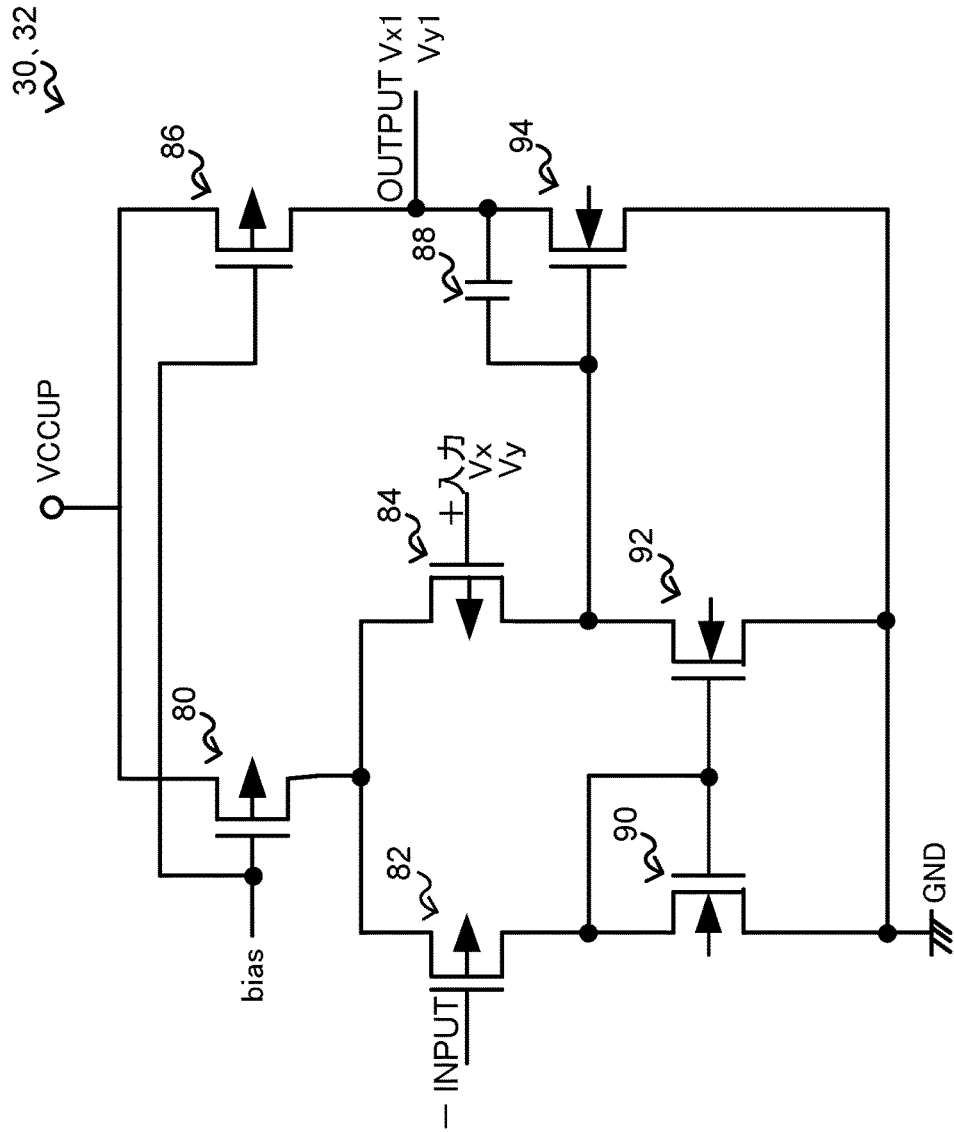
FIG. 5 is a circuit diagram of a specific example of a buffer amplifier.

In the battery monitoring IC 20 of the present exemplary embodiment, in a case in which measuring the battery voltage of the battery cell Vc5, upon supplying the voltage VCC as-is to the buffer amplifiers 30, 32 as a driving voltage, at the buffer amplifier 30 connected to the positive electrode side of battery cell Vc5 the voltage Vx becomes Vx=V5=VCC. Thus, as the value of the voltage input to the non-inverting input terminal of the buffer amplifier 30 and the value of the driving voltage of the buffer amplifier 30 are both at the same voltage VCC, the MOS transistors (PMOS transistors 80, 82, 84, 86 and NMOS transistors 90, 92, 94 illustrated in FIG. 5) in the buffer amplifier 30 operate in the non-saturated region, and the offset voltage in the output of the buffer amplifier 30 increases. The measurement accuracy of the battery voltages using outputs Vx1, Vy1 may decrease due to the effect of this offset voltage.

In the battery monitoring IC 20 of the present exemplary embodiment, the voltage VCC is boosted by the boosting section 50 to a power supply voltage VCCUP that causes the MOS transistors in the buffer amplifiers 30, 32 to operate in the saturation region, and the boosted power supply voltage VCCUP is supplied to the buffer amplifiers 30, 32. Accordingly, as the MOS transistors that configure the buffer amplifiers 30, 32 operate in the saturation region, the offset voltage may be suppressed, and the effect of the offset voltage on the voltages Vx1, Vy1 output from the buffer amplifiers 30, 32 may be prevented. Thus, in the battery monitoring IC 20 of the present exemplary embodiment, the measurement accuracy of the battery voltages using output Vout output from the comparison section 28 may be increased.

The voltage VCC boosted by the boosting section 50 need only be such that the MOS transistors of the buffer amplifiers 30, 32 are caused to operate in the saturation region. Accordingly, although a specific example was given above in which the voltage VCC was boosted by 5 V, the specific voltage value may be determined in accordance with the specifications of the MOS transistors of the buffer amplifiers 30, 32.

The diagnostic section 18 of a battery monitoring system 10 of the present exemplary embodiment performs measurement of the battery voltages of battery cells Vc1 to Vc5 based on the output Vout output from the battery monitoring IC 20 as described above.

Next, explanation follows regarding the diagnosis of malfunction in the boosting circuit 24 of the boosting section 50 included in the battery monitoring IC 20 of the present exemplary embodiment. There is no limitation to the timing at which diagnostics are performed, and the diagnostics may, for example, be performed regularly at predetermined timings.

Note that, in the battery monitoring IC 20 of the present exemplary embodiment, there are two methods for diagnosing a malfunction in the boosting circuit 24. Explanation follows regarding these two methods with reference to a first example and a second example, respectively. Note that, either the method of the first example or of the second example to diagnose malfunction may be used, and there is no limitation thereto.

First Example

Figure 2:
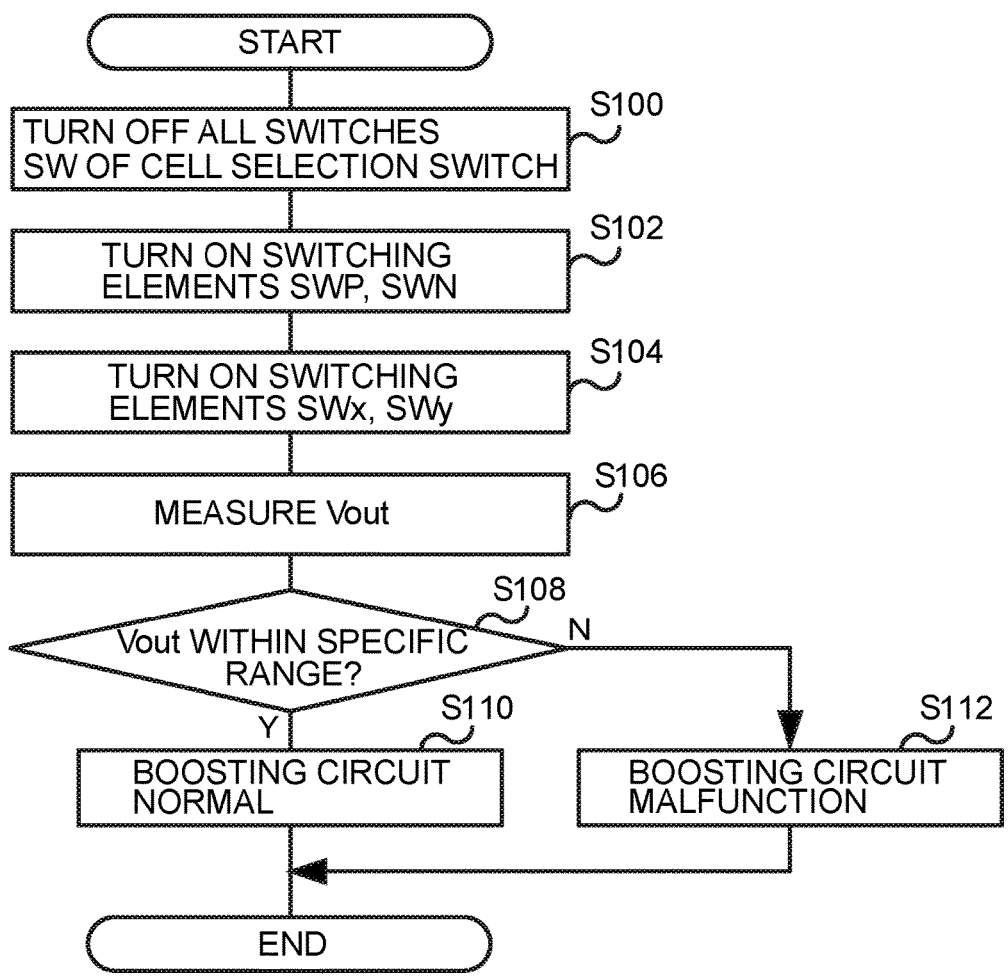
FIG. 2 is a flowchart illustrating a flow of first malfunction diagnosing processing of a boosting circuit in a battery monitoring IC according to an exemplary embodiment.

An example flow of malfunction diagnosing processing of the present example for the boosting circuit 24 in the battery monitoring system 10 (battery monitoring IC 20) is illustrated in FIG. 2. Note that the switching element SWC of the bypass section 38 is set in the OFF state.

At step S100, the switching elements SW of the cell selection switch 26 are all turned to the OFF state by a control signal output from the controller 22.

At next step S102, the switching element SWP of the bypass section 34 and the switching element SWN of the bypass section 36 are turned to the ON state by a control signal output from the controller 22.

The non-inverting input terminal and the output terminal of the buffer amplifier 30 are connected by placing the switching element SWP of the bypass section 34 in the ON state. The non-inverting input terminal and the output terminal of the buffer amplifier 32 are connected by placing the switching element SWN of the bypass section 36 in the ON state.

At next step S104, the switching element SWx and the switching element SWy are turned to the ON state by a control signal output from the controller 22.

The other end (the output side) of the boosting circuit 24 is connected to the bypass section 34 and the non-inverting input terminal of the buffer amplifier 30 by placing the switching element SWx in the ON state. The one end (the input side) of the boosting circuit 24 is connected to the bypass section 36 and the non-inverting input terminal of the buffer amplifier 32 by placing the switching element SWy in the ON state.

At next step S106, the output Vout is measured.

The power supply voltage VCCUP output from the boosting circuit 24 is input to the non-inverting input terminal of the amplifier 40 of the comparison section 28 through the second series element section 54 and the bypass section 34.

The voltage VCC prior to input to the boosting circuit 24 is input to the inverting input terminal of the amplifier 40 through the first series element section 52 and the bypass section 36.

Accordingly, a voltage that corresponds to a difference between the power supply voltage VCCUP that was boosted by the boosting circuit 24 and the voltage VCC (VCCUP−VCC) is output as output Vout from the amplifier 40 to the diagnostic section 18. The diagnostic section 18 measures the output Vout.

At next step S108, determination is made as to whether or not the output Vout is within a specific range. In cases in which the boosting circuit 24 is operating normally, the output Vout is the boost voltage of the boosting circuit 24 (5 V in the specific example above). In cases in which the output Vout is within a specific range from the boost voltage of the boosting circuit 24, based on the boost voltage of the boosting circuit 24 and taking into account a permissible range obtained through experimentation or the like, the boosting circuit 24 is determined to be operating normally by the diagnostic section 18.

In cases in which the output Vout is within the specific range, affirmative determination is made and processing proceeds to step S110. At step S110, after the diagnostic section 18 has diagnosed the boosting circuit 24 as being normal, the present diagnostic processing is ended.

In cases in which the output Vout is not within the specific range (lies outside the range), negative determination is made and processing proceeds to step S112. At step S112, after the diagnostic section 18 has diagnosed the boosting circuit 24 as being malfunction, the present diagnostic processing is ended.

In the malfunction diagnosing processing of the present example, in the battery monitoring IC 20 of the battery monitoring system 10, the other side (the output side) of the boosting circuit 24 and the non-inverting input terminal of the buffer amplifier 30 are connected via the resistance element R6 by the switching element SWx. The power supply terminal 23 (the one end (the input side) of the boosting circuit 24) and the non-inverting input terminal of the buffer amplifier 32 are connected via the resistance element R5 by the switching element SWy. Additionally, the switching element SWP of the bypass section 34 and the switching element SWN of the bypass section 36 are turned to the ON state.

The diagnostic section 18 measures the output Vout=VCCUP−VCC output from the comparison section 28.

If the boosting circuit 24 of the boosting section 50 is operating normally, the output Vout is similar to the boost voltage of the boosting circuit 24. However, in cases in which the output Vout is not similar to the boost voltage of the boosting circuit 24, the boosting circuit 24 can be diagnosed as malfunction.

Second Example

Figure 3:
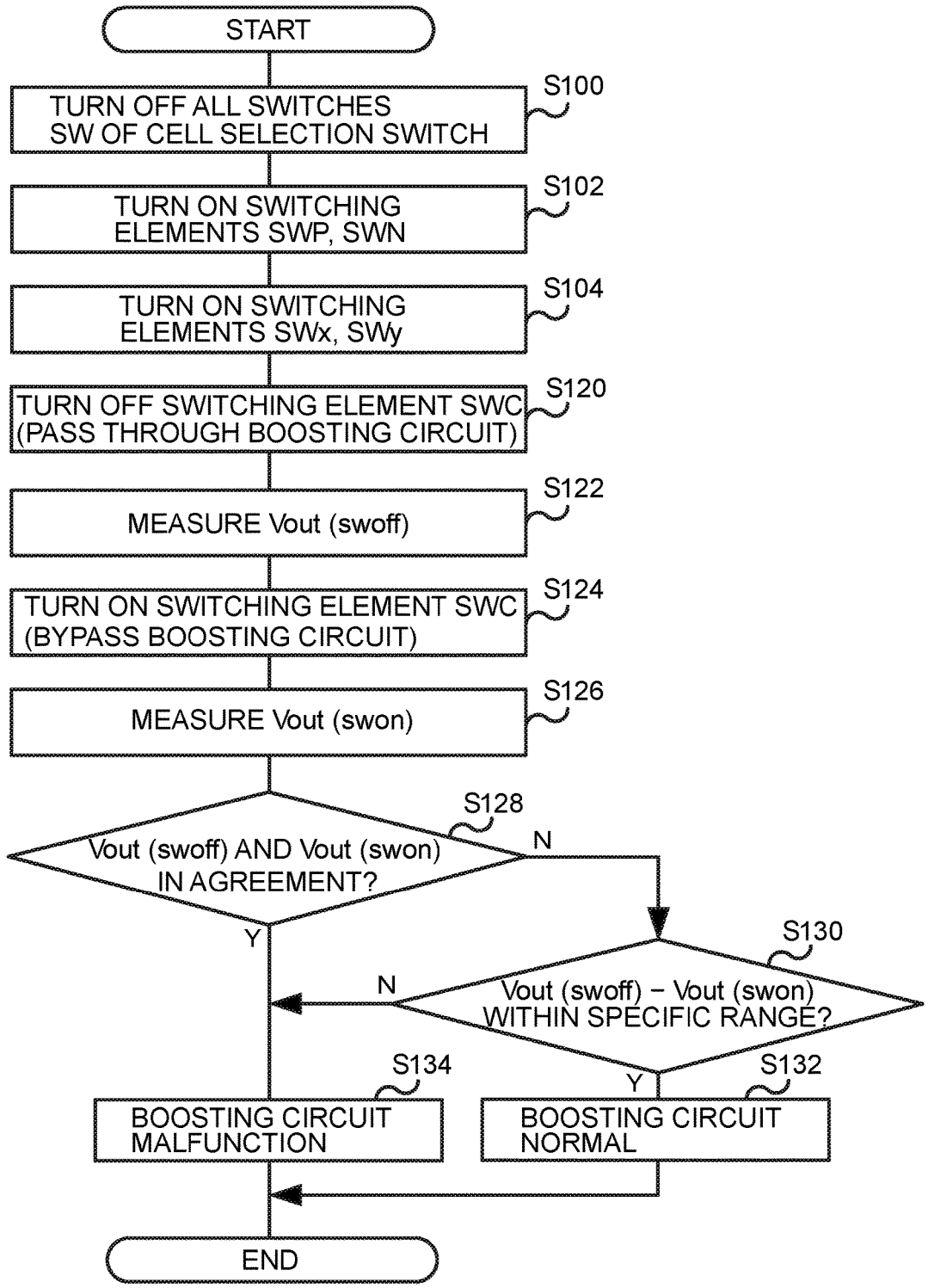
FIG. 3 is a flowchart illustrating a flow of second malfunction diagnosing processing of a boosting circuit in a battery monitoring IC according to an exemplary embodiment.

An example flow of malfunction diagnosing processing in the battery monitoring IC 20 of the present example is illustrated in FIG. 3.

The processing of steps S100 to S104 is similar to that of the malfunction diagnosing processing of the first example (see FIG. 2), and explanation thereof is omitted.

At step S120 following step S104, the switching element SWC is turned to the OFF state by a control signal output from the controller 22.

At next step S122, the output Vout (swoff) is measured. In such cases, a voltage that corresponds to a difference between the power supply voltage VCCUP that was boosted by the boosting circuit 24 and the voltage VCC (VCCUP−VCC) is output as output Vout (swoff) from the comparison section 28 to the diagnostic section 18. The diagnostic section 18 measures the output Vout (swoff).

At the next step S124, the switching element SWC is turned to the ON state and the boosting of the boosting circuit 24 is stopped by a control signal output from the controller 22. Current thus flows without passing through the boosting circuit 24.

The voltage VCC is thereby input to the non-inverting input terminal of the amplifier 40 of the comparison section 28 through the second series element section 54 and the bypass section 34.

The voltage VCC prior to input to the boosting circuit 24 is input to the inverting input terminal of the amplifier 40 through the first series element section 52 and the bypass section 36.

Consequently, a voltage that corresponds to a difference between the voltage VCC and the voltage VCC (VCC−VCC) is output from the amplifier 40 as output Vout (swon) to the diagnostic section 18.

At next step S126, the diagnostic section 18 measures the output Vout (swon)

At next step S128, the diagnostic section 18 determines whether or not the output Vout (swoff) matches with the output Vout (swon).

In cases in which the boosting circuit 24 is operating normally, the difference between the output Vout (swoff) and the output Vout (swon) is the boost voltage of the boosting circuit 24 (5 V in the specific example above). Namely, Vout (swoff)−Vout (swon)≈5 V.

In contrast thereto, in cases in which the boosting circuit 24 is hardly operating (hardly boosting), there is almost no difference between the output Vout (swoff) and the output Vout (swon). Namely, Vout (swoff)−Vout (swon)≈0 V.

Accordingly, in the present example, in cases in which Vout (swoff)−Vout (swon) is within the specific range, based on the boost voltage of the boosting circuit 24 and taking into account a permissible range obtained through experimentation or the like, the boosting circuit 24 is determined to be operating normally by the diagnostic section 18.

In cases in which the diagnostic section 18 compares the output Vout (swoff) and the output Vout (swon) and the output Vout (swoff) matches with the output Vout (swon), affirmative determination is made at step S128 and processing proceeds to step S134. At step S134, after the diagnostic section 18 has diagnosed the boosting circuit 24 as being malfunction, the present diagnostic processing is ended.

In cases in which the output Vout (swoff) do not match with the output Vout (swon), negative determination is made at step S128, and processing proceeds to step S130. At step S130, the diagnostic section 18 determines whether or not Vout (swoff)−Vout (swon) is within the specific range. In cases in which Vout (swoff)−Vout (swon) is not within the specific range, negative determination is made, and processing proceeds to step S134. As described above, after the boosting circuit 24 has been diagnosed as being malfunction, the present diagnostic processing is ended.

In cases in which Vout (swoff)−Vout (swon) is within the specific range, affirmative determination is made at step S130 and processing proceeds to step S132. At step S132, after the diagnostic section 18 has diagnosed the boosting circuit 24 as being normal, the present diagnostic processing is ended.

The result of diagnosing the boosting circuit 24 with the diagnostic section 18 may be output to outside the battery monitoring system 10, or may be stored in a storage section (not illustrated in the drawings) or the like inside the battery monitoring system 10.

In the malfunction diagnosing processing of the present example, in the battery monitoring IC 20 of the battery monitoring system 10, the other side (the output side) of the boosting circuit 24 and the non-inverting input terminal of the amplifier 40 are connected via the resistance element R6 by the switching element SWx and the switching element SWP in a case in which performing diagnostics on the boosting circuit 24. The inverting input terminal of the amplifier 40 and the power supply terminal 23 (the one end (the input side) of the boosting circuit 24) are connected via the resistance element R5 by the switching element SWy and the switching element SWN.

The diagnostic section 18 compares the output Vout=VCCUP−VCC output from the comparison section 28 when the switching element SWC of the bypass section 38 is in the OFF state and boosting is enabled, and the output Vout=VCCUP−VCC output from the comparison section 28 when the switching element SWC of the bypass section 38 is in the ON state and boosting is disabled.

If the boosting circuit 24 is operating normally, the difference between the output Vout when boosting is enabled and the output Vout when boosting is disabled is similar to the boost voltage of the boosting circuit 24. However, when the difference is not similar to the boost voltage of the boosting circuit 24, the boosting circuit 24 can be diagnosed as malfunction.

In the battery monitoring system 10 (the battery monitoring IC 20) of the present exemplary embodiment, diagnostics can be performed on the boosting circuit 24 of the boosting section 50 as described above. In the malfunction diagnosing processing of the first example, the boosting circuit 24 can be diagnosed using the equation output Vout=VCCUP−VCC. In the malfunction diagnosing processing of the second example, the boosting circuit 24 can be diagnosed using the difference between the output Vout=VCCUP−VCC in a case in which boosting is enabled and the output Vout=VCCUP (at the same potential as VCC)−VCC in a case in which boosting is disabled. Accordingly, the boosting circuit 24 may be diagnosed without relying on the battery voltage of the battery cell Vc5 (the highest potential of the battery cells Vc).

Accordingly, in the battery monitoring system 10 (the battery monitoring IC 20) of the present exemplary embodiment, malfunction in the boosting circuit 24 of the boosting section 50 may be diagnosed even in a case in which the voltage of the battery cells Vc is low.

In the battery monitoring IC 20 of the present exemplary embodiment, the diagnostic accuracy of the boosting circuit 24 may be improved with very minimal addition of configuration, compared to the battery monitoring IC employed to measure the battery voltage of the battery cells Vc of the assembled battery 14. Therefore, in the battery monitoring IC 20 of the present exemplary embodiment, an increase in circuit size and an increase in cost may be suppressed.

Figure 4:
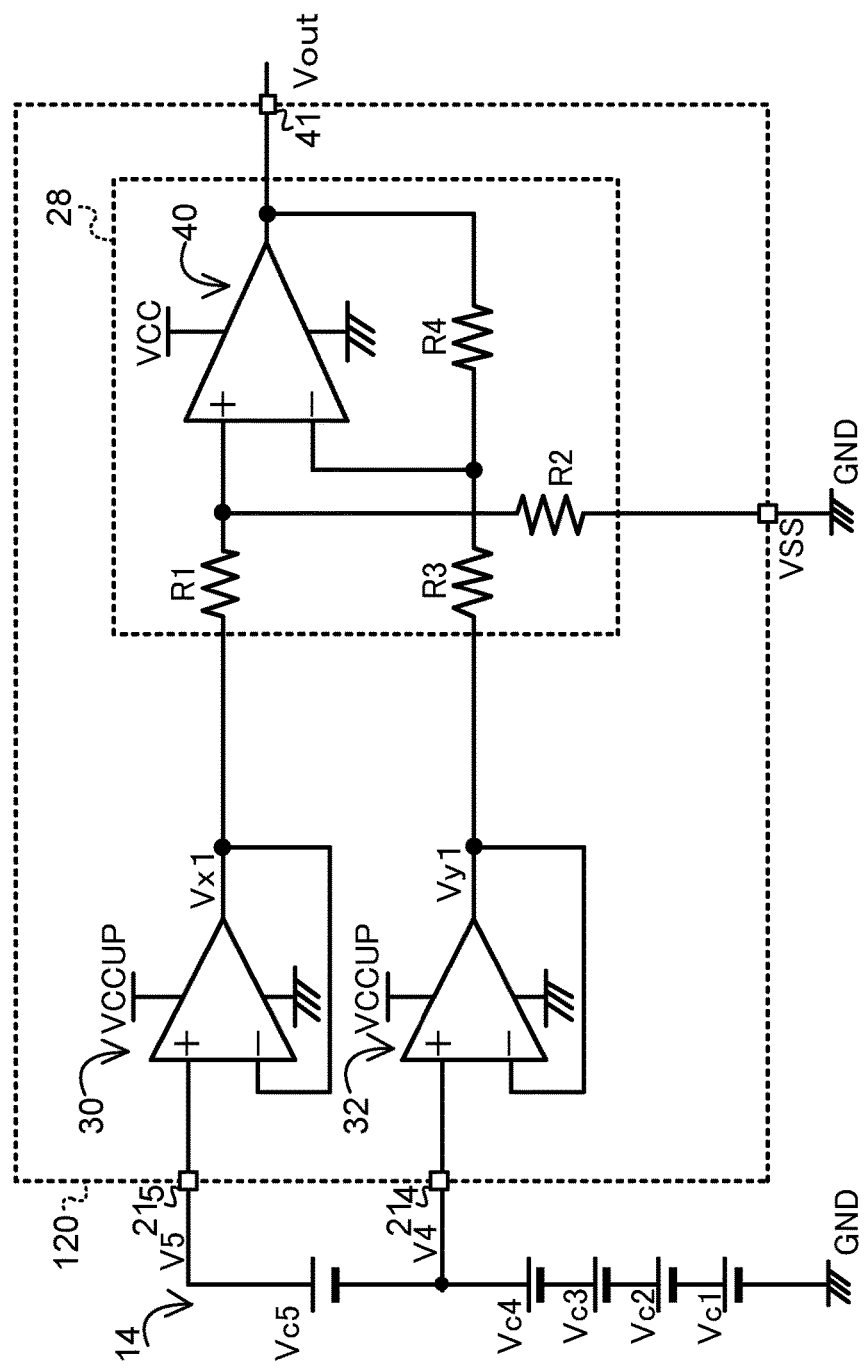
FIG. 4 is circuit diagram for explaining diagnosing a boosting circuit by a battery monitoring IC in a conventional battery monitoring system.

In the battery monitoring IC 20 of the present exemplary embodiment, in a case in which performing diagnostics on the boosting circuit 24, the switching element SWP of the bypass section 34 and the switching element SWN of the bypass section 36 and turned to the ON state, and the buffer amplifiers 30, 32 are bypassed. In a case in which the buffer amplifier 30 is passed through, as a result of the voltage Vx input to the non-inverting input terminal becoming equal to power supply voltage VCCUP, and the margin between the voltage Vx and the power supply voltage VCCUP used to drive the buffer amplifier 30 decreasing, the output voltage of the buffer amplifier 30 decreases (a decrease equivalent to Vsat1 explained in the battery monitoring IC 120 illustrated in FIG. 4). In the battery monitoring IC 20, this issue may be avoided by bypassing the buffer amplifiers 30, 32.

Note that the switching elements SWx, SWy, SWC, SWP, and SWN provided to the battery monitoring IC 20 of the present exemplary embodiment may be switching elements that control a physical bypass route, and may be logic control switching elements that control switching between being functionally ENABLE and DISENABLE (ON and OFF). There is no particular limitation thereto.

Moreover, in the battery monitoring system 10 of the present exemplary embodiment, although explanation has been given regarding a case in which the assembled battery 14 includes five battery cells Vc (battery cells Vc1 to Vc5), there is no limitation to the number thereof

What is claimed is:

1. A battery monitoring integrated circuit (IC) comprising:
   an input section to which a first voltage is input from a battery cell;
   a boosting section including one end to which the first voltage from the input section is input, and another end that, based on a control signal from a control section, outputs the first voltage or a second voltage boosted from the first voltage as a power supply voltage;
   a comparison section including an output section, a first input section connected to the input section and the one end of the boosting section, and a second input section connected to the another end of the boosting section, the comparison section configured to output a voltage from the output section that corresponds to a difference between voltages input to the first input section and the second input section;
   a first buffer section that is driven by the power supply voltage, that is connected to the another end of the boosting section, and that includes an input terminal to which the power supply voltage from the another end of the boosting section is input and an output terminal connected to the second input section of the comparison section;
   a first bypass section that includes a first switch connecting the input and output terminals of the first buffer section;
   a second buffer section that is driven by the power supply voltage, that is connected to the one end of the boosting section, and that includes an input terminal to which the power supply voltage from the one end of the boosting section is input and an output terminal connected to the first input section of the comparison section;
   a second bypass section that includes a second switch connecting the input and output terminals of the second buffer section;
   a first series element section, connected between the boosting section and the second buffer section, that includes a first resistance element and a third switch connected in series, the first series element section including one end connected directly to the input section and the one end of the boosting section, and including another end connected to the input terminal of the second buffer section; and
   a second series element section, connected between the boosting section and the first buffer section, that includes a second resistance element and a fourth switch connected in series, the second series element section including one end connected directly to the another end of the boosting section, and including another end connected to the input terminal of the first buffer section.

2. The battery monitoring IC of claim 1, wherein the boosting section comprises:
   a boosting circuit that boosts the first voltage to the second voltage; and
   a third bypass section that includes a fifth switch, the third bypass section including one end connected to the one end of the boosting circuit, and another end connected to the another end of the boosting circuit.

3. The battery monitoring IC of claim 1, wherein the battery cell is a battery cell included in an assembled battery having a plurality of battery cells connected in series, and
   the battery monitoring IC further comprises a cell selection switch that selectively connects a high potential side of the battery cells of the assembled battery with the first buffer section, and that selectively connects a low potential side of the battery cells of the assembled battery with the second buffer section.

4. A semiconductor device comprising:
the battery monitoring IC of claim 1; and
a diagnostic controller configured to output the control signal and to control the first through fourth switches to provide the first voltage and the second voltage respectively to the first input section and the second input section of the comparison section, to determine malfunction of the boosting section based on the output voltage from the output section of the comparison section.

* * * * *